United States Patent
Kabat et al.

Patent Number: 5,353,198
Date of Patent: Oct. 4, 1994

[54] SIDE PLATES FOR RETROFIT CARD FILE ADAPTER ASSEMBLY

[75] Inventors: Zbigniew Kabat, Chicago; Richard A. Walton, Carol Stream, both of Ill.

[73] Assignee: AG Communication Systems Corporation, Phoenix, Ariz.

[21] Appl. No.: 933,281

[22] Filed: Aug. 21, 1992

[51] Int. Cl.⁵ .................. H05K 7/14; A47G 19/08
[52] U.S. Cl. .................. 361/802; 211/41;
361/796; 361/797; 361/731; 361/729; 439/61;
439/64; 220/287
[58] Field of Search .................. 211/41; 361/796, 797,
361/802, 825, 729, 730, 732, 735, 736, 752, 756,
759, 796, 797, 801; 439/61, 64; 220/212, 255,
254, 287, 617, 618, 629

[56] References Cited

U.S. PATENT DOCUMENTS

| | | | |
|---|---|---|---|
| 3,640,399 | 2/1972 | Hartman | 211/41 |
| 4,498,118 | 2/1985 | Bell | 361/802 |
| 4,506,785 | 3/1985 | Seefeldt | 211/41 |
| 5,172,306 | 12/1992 | Cantrell | 439/61 |

FOREIGN PATENT DOCUMENTS

| | | | |
|---|---|---|---|
| 684282 | 4/1964 | Canada | 211/41 |
| 0453668 | 10/1991 | European Pat. Off. | 361/797 |
| 2324755 | 11/1973 | Fed. Rep. of Germany | 439/64 |

Primary Examiner—Leo P. Picard
Assistant Examiner—Donald A. Sparks
Attorney, Agent, or Firm—Robert J. Black; Gregory G. Hendricks

[57] ABSTRACT

An adapter for supporting e number of printed wiring cards onto an electronic equipment rack equipped with means of support for cards of a larger size. The adapter includes end plates mentioned to fit into the mounting hardware of an existing rack normally providing space for larger cards. The end plates and sides being virtually identical to the older type and size of printed wiring card.

5 Claims, 3 Drawing Sheets

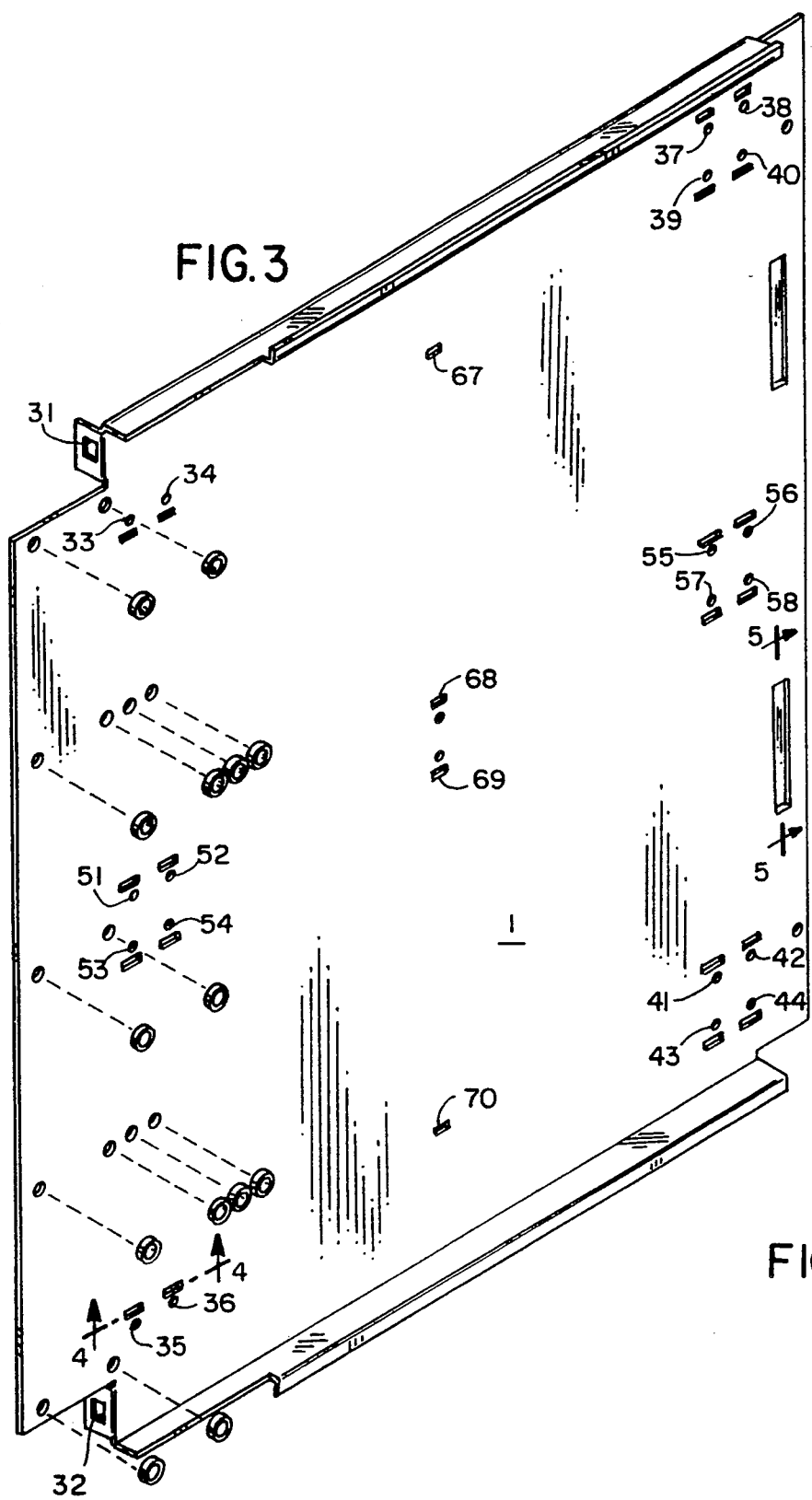
FIG. 3
FIG. 5
FIG. 4

SIDE PLATES FOR RETROFIT CARD FILE ADAPTER ASSEMBLY

BACKGROUND OF THE INVENTION

1. FIELD OF THE INVENTION

The present invention relates to hardware for mounting printed wiring cards and more particularly to novel card file assembly adapted to facilitate the placement of printed wiring cards employing current packaging methods into existing frame hardware designed to accommodate an older technology.

2. BACKGROUND ART

At the present time, large computing facilities or telephone central office systems are generally constructed with a number of hardware frames adapted to receive substantial quantities of printed wiring cards. Electrical functions or sub units are provided in increments of such card files mounted in equipment frames. It has been found that implementation of new technology into existing electrical functions is typically provided in new production only. Adaptation of these newer technologies to field implementation is often extremely difficult to accomplish due to substantial mechanical differences particularly as to differences in mounting space between old and new technology hardware.

Where electronic circuitry is incorporated in products which have been in production for a substantial number of years, the amount of technological change over the years can be extremely large. Usually the only way that customers or users of the newer technology receive the benefits of new technology is by ordering new equipment providing additional frame space to mount such new equipment. This latter is the usual case, particularly since existing field locations do not receive the benefits afforded by the newer mounting technologies. Accordingly, it is the object of the present invention to provide a card file design that fits within the envelope size of existing card files. By incorporating new side plate designs it is possible for such provision to allow customers and users to upgrade existing electrical functions to newer technology without encountering many of the pitfalls or difficulties frequently encountered in such situations. The arrangement presented also provides the additional feature of being able to add a completely new function to the unit by utilizing the spare card files of the older technology.

SUMMARY OF THE INVENTION

In order to best accomplish the objective of the present invention there is provided a retrofit module card file assembly. The card file is designed in such a manner to fit within the existing technology card file space. More specifically, the proposed card file assembly, which includes side plates of novel design, fits within the envelope of an existing older technology card file assembly. Since the new card file assembly provides a method to replace or retrofit existing electronic functions with one using more current electronic packaging techniques or methods. The more current method reduces the size required to implement the electronic function by 50% without changing existing frame hardware.

In at least one practical embodiment of the present invention there is provided a retrofit module card file that can house 4 U and 8 U card sizes but can readily be applied to other physical card sizes. The 4 U and 8 U card sizes are standard sizes as manufactured by AG Communication Systems Corporation, with 8 U card sizes being twice the height of 4 U card sizes and thus able to accomplish all the usual circuit density.

The overall retrofit module card file of the present invention height is that of the standard 8 U card which fits within an existing double height card file. A key innovation is the sizing of the novel side plates incorporated such that they are dimensionally equivalent in the vertical dimension to the double height cards of existing technology. According to the present invention the retrofit module card file assembly is able to slide completely intact into an existing card file location in the same manner as an existing card. Thus the completed assemblies utilizing the novel side plates of the present invention can now provide the retrofit or upgraded function as far as circuit and mounting techniques are concerned into existing older technology hardware.

BRIEF DESCRIPTION OF THE DRAWINGS

A better understanding of the present invention may be had from a consideration of the following detailed description taken in conjunction with the accompanying drawings in which:

FIG. 3 is a perspective view of a side plate as utilized in a retrofit module card file assembly in accordance with the present invention.

FIG. 4 is a sectional view taken along lines A—A of FIG. 3 showing certain details of mounting bosses as incorporated in the side plates utilized in a retrofit module card file assembly in accordance with the present invention.

FIG. 5 is a sectional view taken along lines B—B of FIG. 3 of a number of similar projections included in the side plate of a retrofit module card file assembly in accordance with the present invention.

DESCRIPTION OF THE PREFERRED EMBODIMENT

Figure 1:
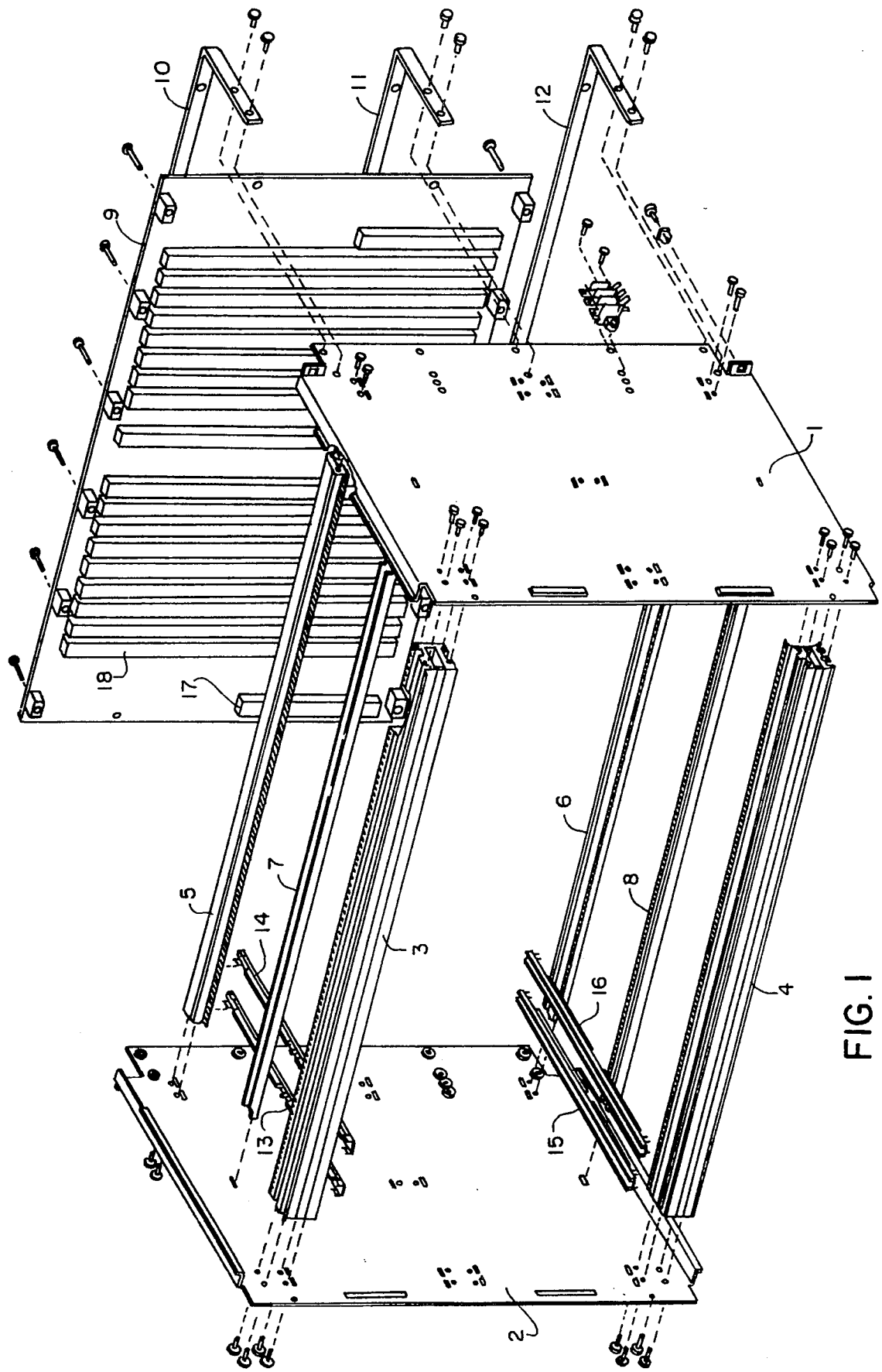
FIG. 1 is an exploded perspective view of a retrofit module card file assembly in accordance with the present invention.
Figure 2:
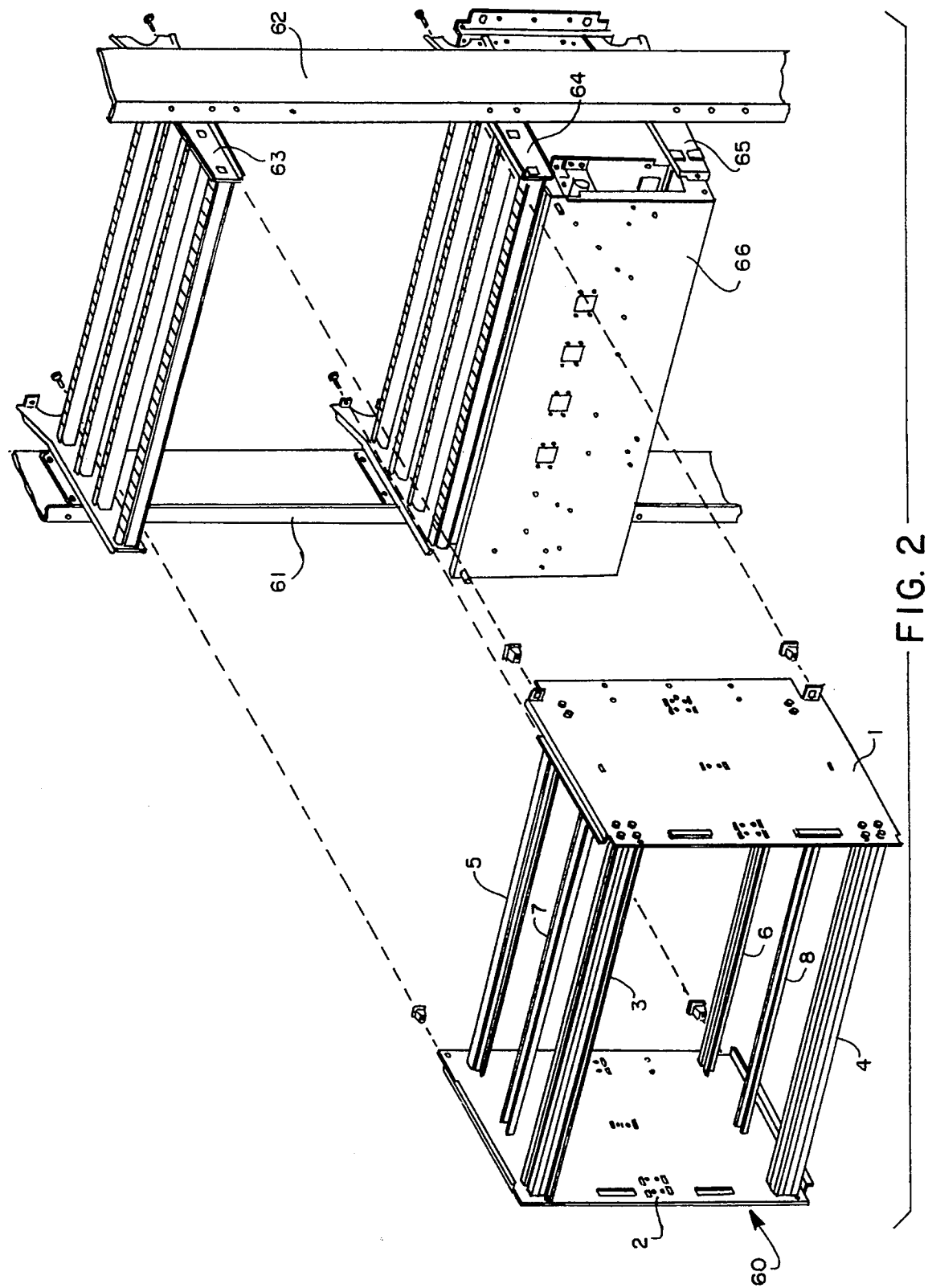
FIG. 2 is a perspective view showing a typical application of the retrofit card file assembly in accordance with the present invention.

Referring now to FIGS. 1 and 2, the retrofit module card file of the present invention is shown in an exploded detail. The card file consists of side plates 1 and 2. Side plate 2 is, as may be seen, a mirror image of side plate 1. Joining side plates 1 and 2 together are top front extrusion 3 and bottom front extrusion 4. Also joining side plates 1 and 2 together are top rear extrusion 5 and bottom rear extrusion 6. The ends of the rear top and bottom extrusions positioned on bosses 33 to 44 are all tapped to receive hex head machine screws which are used to secure side plates 1 and 2 to the extrusions in the manner shown. Also providing additional strength and maintaining proper spacing of side plates 1 and 2 are upper card support bracket 7 and lower card support bracket 8. These are anchored into the side plates by tabs on the supports inserted into openings such as 67 to 70 inclusive. Secured into the front and rear top and bottom extrusions are upper card guides 13 and 14 and lower card guides 15 and 16. Card guides 13 and 15 are typically mounted in the even slot position while card guides 14 and 16 are offset slightly (for typical card guide mounting) on the odd slot positions. The extrusions accept projecting fingers on the card guides are assembly techniques well known in the prior art.

Location across the back of the retrofit assembly is backplane 9 which has mounted thereon a number of high density interconnectors shown typically as 17 and 18. The use of such connectors permit a substantially higher number of input and output counts to be used per card. The backplane 9 is assembled to the retrofit module by means of a number of hex head machine screws inserted through bosses projecting from the forward facing portion of a the backplane which are secured into the rear top and bottom extrusions 5 and 6. Extending across the back of the retrofit modules are cable brackets 10, 11 and 12 which facilitate attachment of connecting cables to the card file module assembly. These cable brackets 10, 11 and 12 are secured by means of machine screws or similar devices to the assembly in the manner shown.

Referring now to FIG. 3, details of the side plates 1 and 2 are shown. It being understood that side plate 1 is a mirror image of side plate 2 which is shown in detail in FIG. 3. The side plate is constructed of cold rolled sheet steel and includes a zinc plate yellow chromate plated coating. The most important function of the side plates is that they are of unique design to match the overall dimensions and tolerances of existing printed wiring cards with an older technology. That is to say their design allows them to retrofit the entire module card file assembly utilizing these side plates to rest within the older card files and be locked in place horizontally by the existing card locking mechanism. Most important dimensions, of course, are the height and thickness of the side plates.

Assurance of a good mechanical connection is made by fastening the rear of the side plate in the same location as existing card file backplane fastening interface.

This is accomplished by means of openings in the ears 31 and 32, grommets as seen in FIG. 1 are inserted and subsequently screws are inserted to match existing hardware backplane connections as may be seen in FIG. 2. A number of openings such as 33, 34, 35, 36, 37, 38, 39, 40, 41, 42, 43 and 44 are included, each of which is adapted to accept an 8-32 self-clinching fastener through which an associated 8-32 hex head screw goes to secure the upper of the top and bottom front and rear extrusions to join the two side plates 1 and 2 together. Adjacent to each of the aforementioned holes is a projecting boss or extrusion whose details may be seen in FIG. 4 which is a cross section of the side plate taken along lines A—A. These bosses are an extension aid in locating the side plates with the top and bottom and front and rear extrusions.

It may also be seen that a related number of holes are located adjacent to bosses 51 through 58, respectively, are shown which would provide for additional mounting of extrusions should it be desired to mount two complete rows of 4 U size printed wiring cards in the retrofit module of the present invention. As shown, with the extrusions placed as shown in FIG. 1, the retrofit module is adapted to accept so-called 8 U cards which are double the vertical height of the 4 U cards.

Referring now to FIG. 2, application of the retrofit card file 60 of the present invention is shown. The entire retrofit card file assembly is shown in the opening of an existing card file assembly, with the existing file assembly hardware consisting of vertical supports 61 and 62 and card supports 63 and 64 being of an older existing type. It is noteworthy to indicate that when replacing equivalent electrical functions the retrofit module card file assembly will replace two of the existing card file assemblies. As may be seen, the side plates 1 and 2 function to guide the new assembly into card guide slots.

From the foregoing it may be seen that the retrofit module card file assembly in accordance with the present invention is designed to facilitate the application of new technology to existing card file locations. It also allows for implementation of new electronic functions in existing unused card file locations. While the card file of the present invention can be implemented in a production environment, it probably will find its greater application in the field where it can easily facilitate the application of the new technology equipment into existing or older type hardware mounting locations.

While but a single embodiment of the present invention has been shown, it will be obvious to those skilled in the art that numerous modifications may be made without departing from the spirit of the present invention which should be limited only by the scope of the claims appended hereto.

What is claimed is:

1. A plurality of side plates for use in an adapter for supporting a plurality of printed wiring cards of a first size, adapted for positioning on an electronic equipment rack equipped with means to support a plurality of printed wiring cards of a second size, said adapter including a plurality of parallel positioned extrusions each extending from a first one to a second one of said side plates, said plates positioned vertically and parallel to each other, said side plates each comprising:

a single metal sheet having the thickness of a printed wiring card of said second size and the same vertical dimension as said printed wiring cards of said second size;

each of said side plates further including a top and bottom inward facing lip;

said side plates adapted to be positioned on said support means of said electronic equipment rack as an alternative to printed wiring cards of said second size.

2. Adapter side plates as claimed in claim 1 wherein: each of said side plates includes a plurality of raised bosses on an inward side of said plates providing support and positioning for said extrusions.

3. Adapter side plates as claimed in claim 1 wherein: each side plate further includes a plurality of round openings to facilitate the placement of fastening means through said side plate into said extrusions.

4. Adapter side plates as claimed in claim 3 wherein: each of said round openings further include a self-clinching fastener inserted therein.

5. Adapter side plates as claimed in claim 1 wherein: each of said side plates further includes a plurality of rectangular openings adapted to receive one end of a printed wiring card support bracket extending between said first and second side plates.

* * * * *